United States Patent
Daoud et al.

(10) Patent No.: US 6,273,426 B1
(45) Date of Patent: Aug. 14, 2001

(54) HYDRODYNAMIC SEAL AND A METHOD FOR PROVIDING THE SAME

(75) Inventors: Bassel H. Daoud, Parsippany; Jason Abraham Kay, Morristown; David Steven Kerr, Morris Plains, all of NJ (US); Ronald Marchtsin, Tobbyhanna, PA (US); Lawrence M. Paul, Randolph, NJ (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/359,567

(22) Filed: Jul. 22, 1999

(51) Int. Cl.[7] ............. F16J 15/447; F16J 15/02; H05K 5/06
(52) U.S. Cl. ............ 277/303; 277/312; 277/644; 277/928; 174/17 CT
(58) Field of Search .................. 277/411, 303, 277/312, 928, 927, 628, 644; 174/17 VA, 17 CT, 52.3

(56) References Cited

U.S. PATENT DOCUMENTS

| | | | |
|---|---|---|---|
| 4,207,004 | * | 6/1980 | Hold et al. . |
| 4,465,284 | * | 8/1984 | Szema . |
| 4,723,196 | * | 2/1988 | Hofmeister et al. . |
| 4,979,755 | * | 12/1990 | Leberton . |
| 5,077,536 | * | 12/1991 | Fichot et al. ............ 174/17.05 |
| 5,374,068 | * | 12/1994 | Jewett et al. ............ 277/303 |
| 5,649,859 | * | 7/1997 | Shiga .................. 174/17 VA |
| 5,704,614 | * | 1/1998 | Sanders et al. ............ 277/303 |
| 5,890,873 | * | 4/1999 | Willey .................. 277/303 |

* cited by examiner

Primary Examiner—Chuck Y. Mah
Assistant Examiner—Vishal Patel

(57) ABSTRACT

A hydrodynamic seal efficiently protects an interior cavity of an enclosure from external elements. The seal has an upper portion having a recess formed in a center section of the upper portion. A lower portion, having a raised portion, abuts the upper portion and forms a passage between the two portions. The passage between the upper and lower portions is reduced in area along the recessed and raised portions. When air with water and/or dust passes through the passage, a velocity and pressure change occurs, thereby the water and/or dust is deposited in a channel. The water and/or dust flows along the channel and is exhausted to an external so that the water and/or dust is prevented from entering the interior cavity of the enclosure.

13 Claims, 2 Drawing Sheets

HYDRODYNAMIC SEAL AND A METHOD FOR PROVIDING THE SAME

This invention relates to seals and sealing methods. More particularly, the present invention relates to a hydrodynamic seal and a method for providing the same.

BACKGROUND OF THE INVENTION

In order to protect an interior of a container or enclosure, e.g., circuit enclosures designed to be placed on telephone poles, electrical poles, or homes, the container or enclosure is typically provided with a rubber gasket, gaskets, or the like, positioned along a lip or flange where a top-half and a bottom-half of the container or enclosure meet when the container or enclosure is in a closed position. The rubber gasket is designed to prevent rain, sand, dust, and other particles and debris from entering through the discontinuity formed by the top-half and bottom-half of such an enclosure. However, such an enclosure containment prevention design has specific operational disadvantages and manufacturing disadvantages associated therewith.

In particular, enclosures and containers to protect circuits, wires, and other electrical components, are typically made out of hardened plastic, metal, or the like. The use of such materials is advantageous since these materials can withstand harsh weather conditions for many years without failing. However, it has been found, due the rubber gasket material, or the like, used to protect the enclosures or containers from the exterior elements, preventive maintenance is required to ensure the rubber gasket is free of cracks, dry-rot, deterioration, or the like. Such a maintenance procedure requires a skilled technician to ensure that a rubber gasket installed on such a container or enclosure is free of defect. If the gasket is found to be damaged, then the technician must either replace the gasket in the container or enclosure, and/or the container or enclosure itself. This is a significant disadvantage since the container or enclosure must be inspected at regular intervals, and/or replaced before the exterior portion of the box would normally need replacing.

Another disadvantage in the design of the conventional container or enclosure, occurs at a manufacturing stage of the container or enclosure. Typically, if the container or enclosure is made of a hardened plastic material, then the manufacturing of such is normally done by a mold die. A mold die is manufactured in the desired shape of the enclosure or container. A plurality of these will be made, depending on the manufacturing quantity, and subsequently used during a manufacturing cycle. A molten plastic material is injected into the die, thereby forming the container or enclosure. Subsequent to this process, in order to weatherproof the enclosures or containers, a rubber gasket, or the like, must be adhesively applied to a flange or lip portion of the molded enclosure or container. This process of adhering a rubber gasket is an additional manufacturing step which must be accomplished by either a manual or automated process. Nonetheless, the process of adhering the rubber gasket requires a manufacturing stage which is in addition to the molding of the enclosure or container.

SUMMARY OF THE INVENTION

The hydrodynamic seal of the present invention overcomes one or more of the disadvantages associated with the sealing process of the conventional art. The hydrodynamic seal of the present invention is capable of protecting a cavity, such as an enclosure cavity for sensitive circuits or electronics from external elements without the use of a rubber gasket, or the like. Furthermore, the hydrodynamic seal of the present invention is capable of reducing manufacturing requirements for, but not limited to, enclosures and containers implementing rubber gaskets and seals.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION

Figure 1:
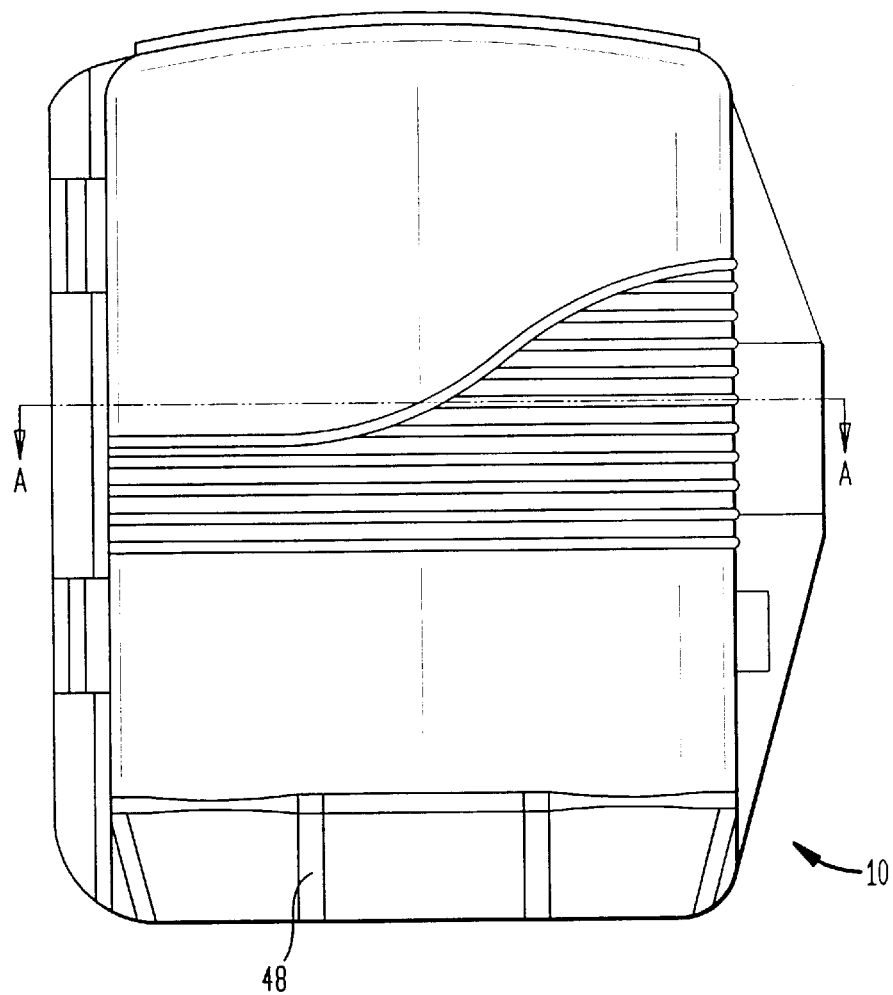
FIG. 1 is a plan view of a circuit enclosure used to illustrate the hydrodynamic seal of the present invention.

FIG. 1 illustrates a wire or circuit enclosure 10 including the hydrodynamic seal 12 (seen in other figures) of the present invention. The circuit or wire enclosure 10 has been used for illustration purposes only. The hydrodynamic seal 12 of the present invention applies to various other containers and enclosures which have not been discussed herein, but would be readily discernable by those skilled in the art.

Figure 2:
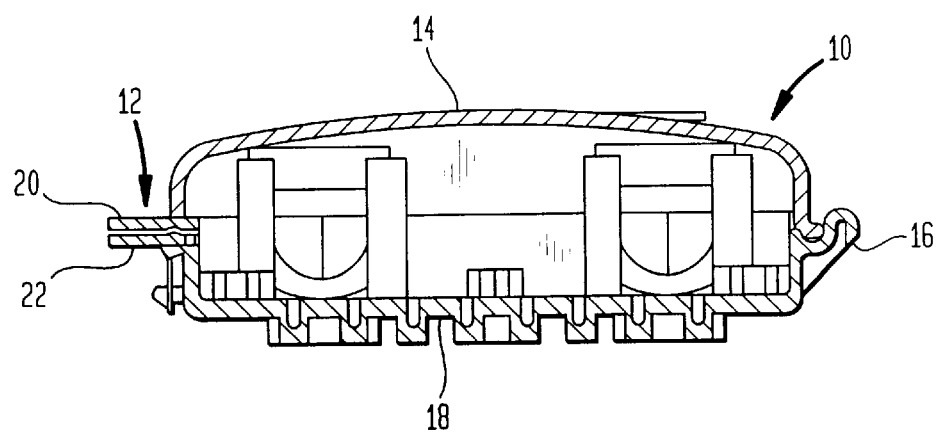
FIG. 2 is a cross-sectional view taken along line A—A of FIG. 1, wherein the hydrodynamic seal of the present invention is illustrated.

FIG. 2 is a cross-sectional view of the circuit enclosure 10 illustrating the hydrodynamic seal 12 of the present invention. The hydrodynamic seal 12 is formed when the circuit enclosure 10 is in the shut position. The shut position is achieved when a top lid 14 is rotated around a hinge 16 such that the top lid 14 abuts with a bottom section 18. The hydrodynamic seal 12 is formed along an upper portion 20 of the top lid 14 and a lower portion 22 of the bottom section 18 and spans the entire perimeter of the circuit enclosure 10 except a bottom end 48 thereof.

Figure 3:
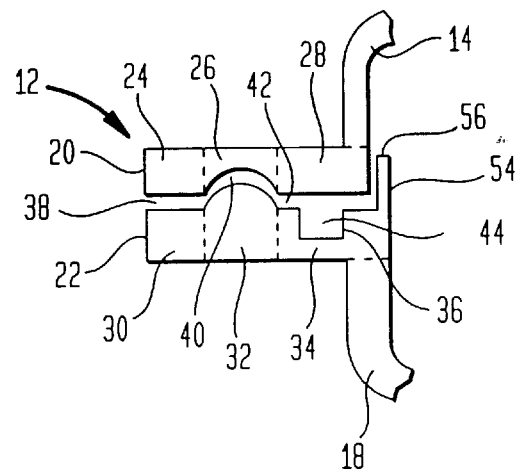
FIG. 3 is an exploded cross-sectional view of the hydrodynamic seal.

FIG. 3 illustrates an expanded view of the hydrodynamic seal 12 shown in FIG. 2. The upper portion 20 of the hydrodynamic seal 12 is divided into various portions. A first portion 24 is at a distal end of the upper portion 20. A second portion 26 is formed directly adjacent to the first portion 24 and has a recessed semicircular concave definition formed therein. A third portion 28 further defines the upper portion 20 and is positioned adjacent the second portion 26. The first portion 24, the second portion 26, and the third portion 28 comprise the entire upper portion 20.

A lower portion 22 extends from the bottom section 18. The lower portion 22 is defined as having a fourth portion 30, a fifth portion 32, and a sixth portion 34. The fifth portion 32 of the lower portion 22 is raised and forms a semicircular rise. The sixth portion 34 has a channel portion 36 centered therein and is further defined by an elongated part 56 which extends along an interior surface of the top lid 14. The fourth portion 30, the fifth portion 32, the sixth portion 34, and the channel portion 36 form the entire length of the lower portion 22.

Although the second portion 26 is defined as being semicircular concave in shape and the fifth portion 32 is defined as being raised and semicircular, the portions may have other various mating shapes. For example, the second portion 26 may be triangular concave in shape and the lower portion 22 may be raised and triangular in shape. The various other shapes may be implemented, and as such they are embraced by the scope of the invention. Furthermore, the second portion 26 and the fifth portion 32 may be positioned such that the raised portion is part of the upper portion 20 and the concave portion is part of the lower portion 22.

When the top lip 14 is rotated about the hinge 16 to abut the bottom section 18, the hydrodynamic seal 12 of the present invention is formed between the upper portion 20 and the lower portion 22, respectively. The passage defined between the upper portion 20 and the lower portion 22 defines various sections of area formed by the portions described hereinabove.

A first area 38 is formed between the first portion 24 and the fourth portion 30. Furthermore, a second area 40 is formed between the second portion 26 and the fifth portion 32 of the upper portion 20 and the lower portion 22, respectively. While the third portion 28 and the sixth portion 34 form a third area 42. The channel portion 36 defined in the lower portion 22 forms a fourth area 44 in addition to the third area 42 defined by the third portion 28 and the sixth portion 34. The defined areas of the hydrodynamic seal 12 are predetermined based on the overall size of the enclosure or container, or the like, on which the hydrodynamic seal 12 is employed.

In accordance with the present invention, as shown with the circuit enclosure 10, the first area 38 has a predetermined area which is defined between the first portion 24 and the fourth portion 30. The second area 40, formed between the second portion 26 and the fifth portion 32, is predetermined and is less than the first area 38. The third area 42, not including the fourth area 44 defined by the channel portion 36, is equal to the first area 38. While, the fourth area 44, formed by the channel portion 36, has a predetermined area which is greater than each of the first area 38, the second area 40, and the third area 42.

Figure 4:
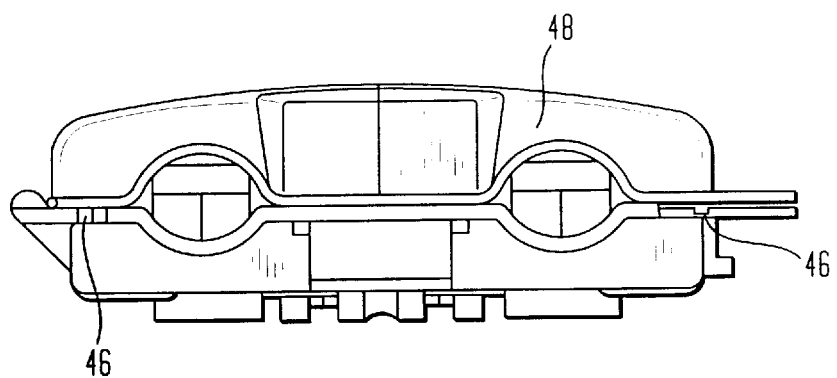
FIG. 4 is a bottom view of the circuit enclosure used to illustrate the hydrodynamic seal of the present invention.

FIG. 4 is a bottom view of the circuit enclosure 10 used to illustrate the hydrodynamic seal 12 of the present invention. Shown on the bottom end 48 of the circuit enclosure 10 are channel exits 46. The channel exits 46, according to the circuit enclosure 10 used to illustrate the hydrodynamic seal 12 of the present invention, are not limited to the positions as shown in FIG. 4. Depending upon the design of the container or enclosure the hydrodynamic seal 12 is implemented on, the positions of the channel exits 46 may be implemented at a wide range of locations along the bottom edge of such a container or enclosure. Moreover, the channel exit 46 may be positioned in any location on such a container or enclosure provided that the channel exits 46 are positioned at a bottom end portion of the container or enclosure when the container or enclosure is operationally positioned.

Figure 5:
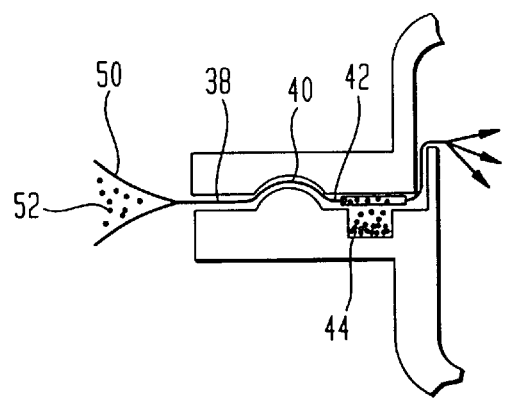
FIG. 5 is an exploded cross-sectional view of the hydrodynamic seal, used to illustrate the functionality of the pressure/velocity differentials.

FIG. 5 illustrates the fundamental operation of the hydrodynamic seal 12. When circuit enclosure 10 is in a shut state, the upper portion 20 and the lower portion 22 form a passage defined therebetween. During operation of the hydrodynamic seal 12, an inflow of gas 50 containing an arbitrary level of water and/or dust 52, enters the first area 38. The pressure and velocity of the gas 50 containing the water and/or dust 52, while in the first area 38, remains constant to a pressure and velocity of the gas 50 before it entered the first area 38. The gas 50 with the water and/or dust particles 52 travels along the first area 38 and enters the second area 40. At this point, since the second area 40 has a smaller area as compared to the first area 38, the gas 50 with the water and/or dust particles 52 experiences a pressure rise, while maintaining the same velocity experienced in the first area 38. The gas 50 with the water and/or dust particles 52 now enters the third area 42. The third area 42 has essentially the same area as the first area 38, but is larger than the second area 40. At this point, the gas 50 with the water and/or dust particles 52 experiences a pressure and velocity drop due to the larger third area 42 as compared to the second area 40. Subsequently, as the gas 50 with water and/or dust particles 52 passes over the channel portion 36, due to the pressure and velocity drop, the water and/or dust particles 52 which are traveling with the gas 50 fall away into the channel portion 36.

The channel portion 36 is defined by the fourth area 44, which has an area greater than each of the first, second, and third areas individually. Therefore, the pressure and velocity again drop significantly, thereby further facilitating the deposit of the water and/or dust particles 52 into the channel 36. After having deposited the water and/or dust particles 52 in the channel portion 36, the inflow of gas 50 moves by the remainder of the sixth portion 34 and past the elongated part 56 which provides a directional change in the inflow of the gas 50. Any remaining particles of the water and/or dust 52 in the inflow of the gas 50 lose any remaining momentum and fall into the channel portion 36. The elongated part 56 further facilitates preventing the water and/or dust particles 52 from leaving the channel portion 36. The gas 50 is then exhausted into the cavity portion 54.

As compared to the other areas discussed, an area defined by the cavity portion 54 is much greater than the areas defined by the hydrodynamic seal 12. Therefore, the inflow of gas 50 experiences a final pressure and velocity drop such that the flow of the gas 50 becomes negligible as compared to the original inflow of the gas 50.

Although the present invention has been illustrated in conjunction with the circuit enclosure 10, it should be readily apparent that the invention would be suitable for different types of enclosures and containers. For example, the hydrodynamic seal 12 of the present invention is readily suitable for containers or enclosures, of various sizes and shapes, which require protection from water, particles, dust, or the like. The hydradynamic seal 12 is also suitable outside the container art in any application where a debris and water tight seal is desired between two mating objects.

The invention being thus described, it would be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A hydrodynamic seal comprising:
a first part having a recess defined therein;
a second part being positioned adjacent said first part; and
a rise formed in said second part, said rise positioned along said recess, wherein when said first part includes a first portion, second portion and third portion and said recess is defined in said second portion, said second part includes a forth portion, fifth portion and sixth portion and said rise is defined in said fifth portion, when said first and second parts are adjacent each other, said first and forth portions form an essentially uniform passage with a first predetermined area defined therebetween, said third and sixth portions further form an essentially uniform passage with a third predetermined area defined therebetween, and said second and fifth portions form a passage defined by said recess and said rise with a second predetermined area defined therebetween, wherein said second predetermined area is the smallest of each of the predetermined areas.

2. The hydrodynamic seal of claim 1, wherein said second part further includes an elongated part which is formed essentially perpendicular to said second part.

3. The hydrodynamic seal of claim 1, wherein said sixth portion includes a channel defined essentially in a center position thereof, wherein said channel facilitates passage of one of at least liquid and particles therein.

4. The hydrodynamic seal of claim 1, wherein said recess is concave and semicircular in shape and said rise is semicircular in shape.

5. The hydrodynamic seal of claim 3, wherein the section of said sixth portion where said channel is formed, a fourth predetermined area is defined.

6. The hydrodynamic seal of claim 5, wherein said second area between said second and fifth portions is less than said first and third areas defined between said first and fourth portions and said third and sixth portions, and where said channel is formed said fourth area is greater than each area defined by said first and forth, said second and fifth portions, and said third and sixth portions where said channel is not formed.

7. A method of providing a hydrodynamic seal having a first passage section being essentially straight, a second passage section being defined by a recess and rise and a third passage section being essentially straight and having a channel defined in an essentially center section thereof, the method comprising the steps of:

allowing an inflow of gas to flow through said first passage section having a first predetermined area, said inflow of gas carrying at least one of liquid and particles;

allowing said inflow of gas to flow through said second passage section having a second predetermined area less than said first predetermined area of said first passage; and allowing said inflow of gas to flow through said third passage having essentially a same predetermined area as said first passage section where said channel portion is not defined.

8. The method as defined in claim 7, further comprising the step of changing the direction of said inflow of gas.

9. The method as defined in claim 7, further comprising the step of exhausting said at least one of said particles and said liquid at a bottom end of said channel.

10. The method as defined in claim 7, further comprising the step of receiving said at least one of liquid and particles in said channel from said inflow of gas, wherein said at least one of liquid and particles flows along said channel and is allowed to exit along a length portion of said channel.

11. The method as defined in claim 10, wherein the step of allowing said inflow of gas through said first passage, a pressure and velocity of said inflow of gas are maintained at a level essentially equal a pressure and velocity of said gas before it enters said first passage.

12. The method as defined in claim 11, wherein the step of allowing said inflow through said second passage, a pressure of said inflow of gas in said second passage is greater than a pressure of said gas in said first passage and a velocity of said gas in said. second passage is maintained at a level essentially equal a velocity of the gas before it enters said second passage.

13. The method as defined in claim 12, wherein the step of allowing said inflow of gas through said third passage, a pressure and velocity of said inflow of gas is less than a pressure and velocity of said gas in said second passage, thereby allowing at least one of said particles to fall away and said liquid to form as a droplet such that at least one of said particles and said liquid droplet collect and flow along said channel.

* * * * *